(12) United States Patent
Ozaki et al.

(10) Patent No.: US 9,653,125 B2
(45) Date of Patent: May 16, 2017

(54) STORAGE DEVICE, MEMORY DEVICE AND SEMICONDUCTOR DEVICE FOR IMPROVING DATA TRANSFER SPEEDS

(71) Applicant: KABUSHIKI KAISHA TOSHIBA, Minato-ku (JP)

(72) Inventors: Shouichi Ozaki, Komae (JP); Kosuke Yanagidaira, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/009,377

(22) Filed: Jan. 28, 2016

(65) Prior Publication Data

US 2017/0076756 A1    Mar. 16, 2017

Related U.S. Application Data

(60) Provisional application No. 62/216,862, filed on Sep. 10, 2015.

(51) Int. Cl.
*G11C 7/10* (2006.01)
*G11C 5/06* (2006.01)
*G11C 5/14* (2006.01)
*G06F 1/26* (2006.01)

(52) U.S. Cl.
CPC ................. *G11C 5/06* (2013.01); *G06F 1/26* (2013.01); *G11C 5/147* (2013.01); *G11C 7/1057* (2013.01); *G11C 7/1084* (2013.01)

(58) Field of Classification Search
CPC .......... G11C 7/10; G11C 7/22; G11C 7/1078; G11C 7/1084; G11C 7/1054; G11C 5/00; G11C 5/14; G11C 11/5642; G11C 11/5628
USPC ............ 365/189.07, 189.09, 189.03, 189.11, 365/189.05, 230.06, 230.08
See application file for complete search history.

(56) References Cited

U.S. PATENT DOCUMENTS

| 6,486,912 | B1 | 11/2002 | Aizawa et al. | |
|---|---|---|---|---|
| 6,958,942 | B2* | 10/2005 | Chang | G11C 7/1051 365/189.05 |
| 7,362,622 | B2* | 4/2008 | Braun | G11C 7/1078 327/72 |
| 8,102,724 | B2* | 1/2012 | Fox | G06F 13/4086 365/189.09 |

* cited by examiner

*Primary Examiner* — Gene Auduong
(74) *Attorney, Agent, or Firm* — Oblon, McClelland, Maier & Neustadt, L.L.P.

(57) ABSTRACT

According to one embodiment, a storage device includes a memory device including a memory cell configured to hold data, an output buffer configured to output the data, and a circuit configured to generate a reference voltage; and a controller device including an input buffer. The data from the output buffer is input into one input terminal of the input buffer and the reference voltage from the circuit is input into the other input terminal of the input buffer.

20 Claims, 8 Drawing Sheets

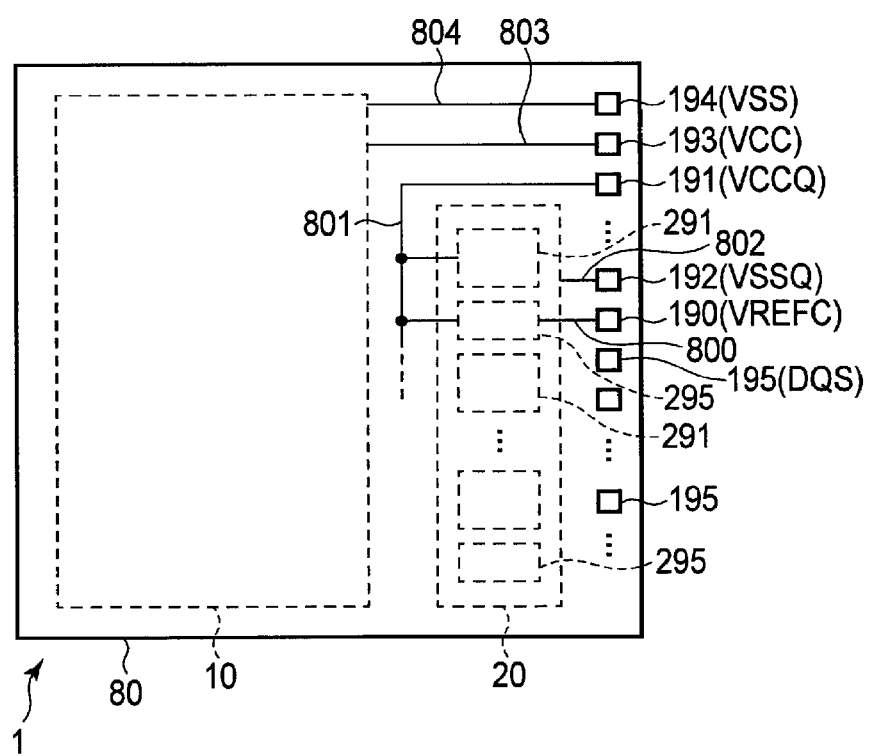
F I G. 2

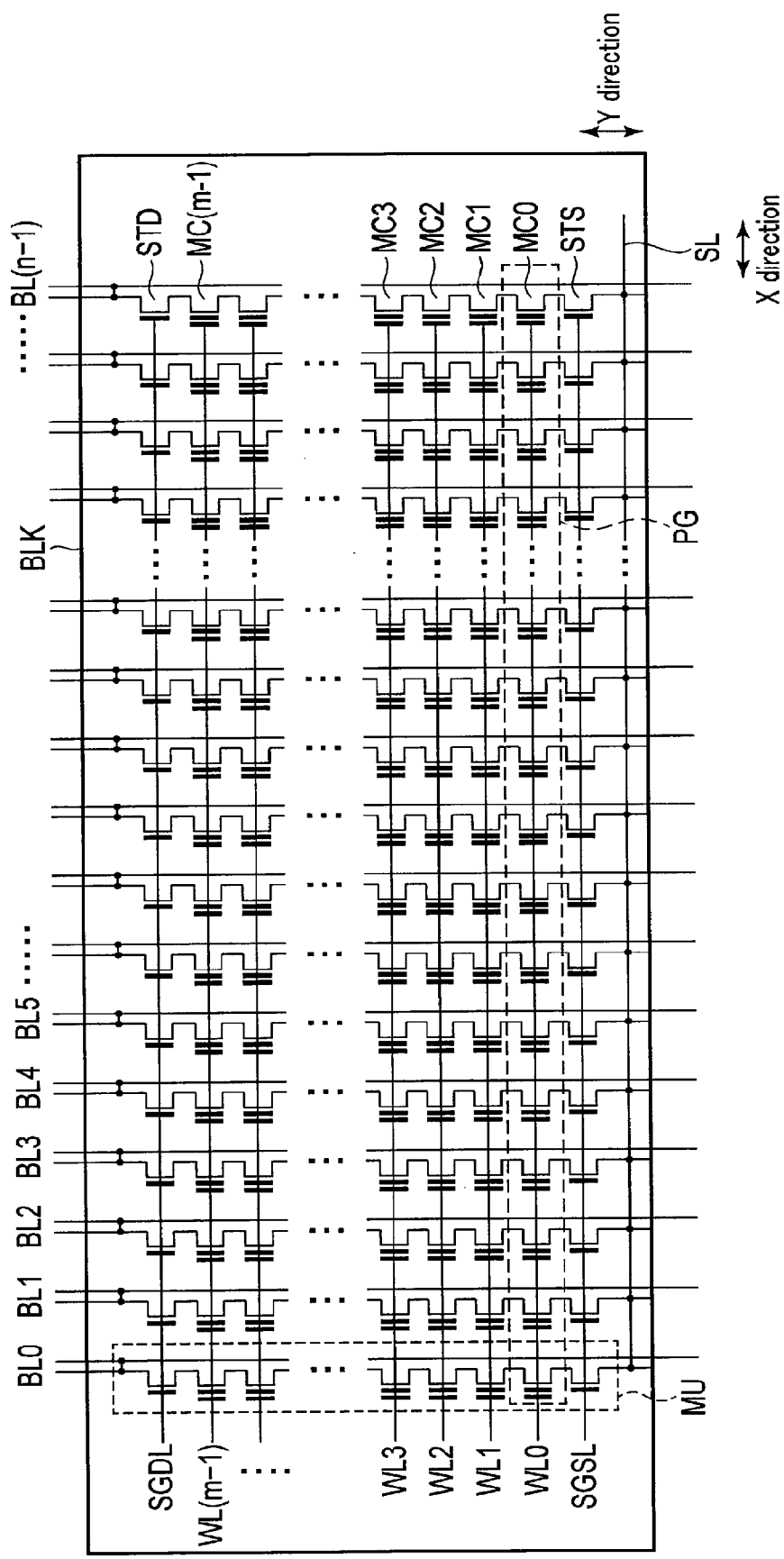
F I G. 4

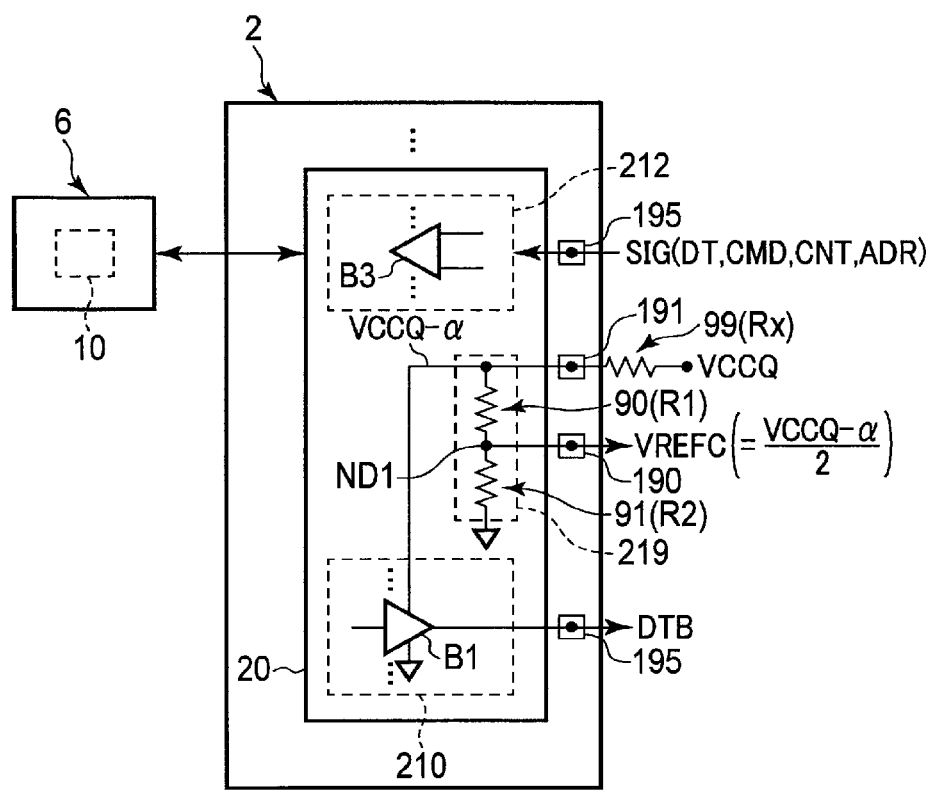
F I G. 8

STORAGE DEVICE, MEMORY DEVICE AND SEMICONDUCTOR DEVICE FOR IMPROVING DATA TRANSFER SPEEDS

CROSS-REFERENCE TO RELATED APPLICATIONS

This application claims the benefit of U.S. Provisional Application No. 62/216,862, filed Sep. 10, 2015, the entire contents of which are incorporated herein by reference.

FIELD

The present embodiment relates to a storage device, a memory device, and a semiconductor device.

BACKGROUND

Storage devices including flash memories are mounted on various electronic devices.

BRIEF DESCRIPTION OF THE DRAWINGS

FIG. 2 is a plan view showing a configuration example of a memory device according to an embodiment;

FIG. 4 is an equivalent circuit diagram showing a configuration example of the memory device according to an embodiment;

FIG. 8 is a diagram showing the modification of the memory device according to an embodiment.

DETAILED DESCRIPTION

Figure 1:
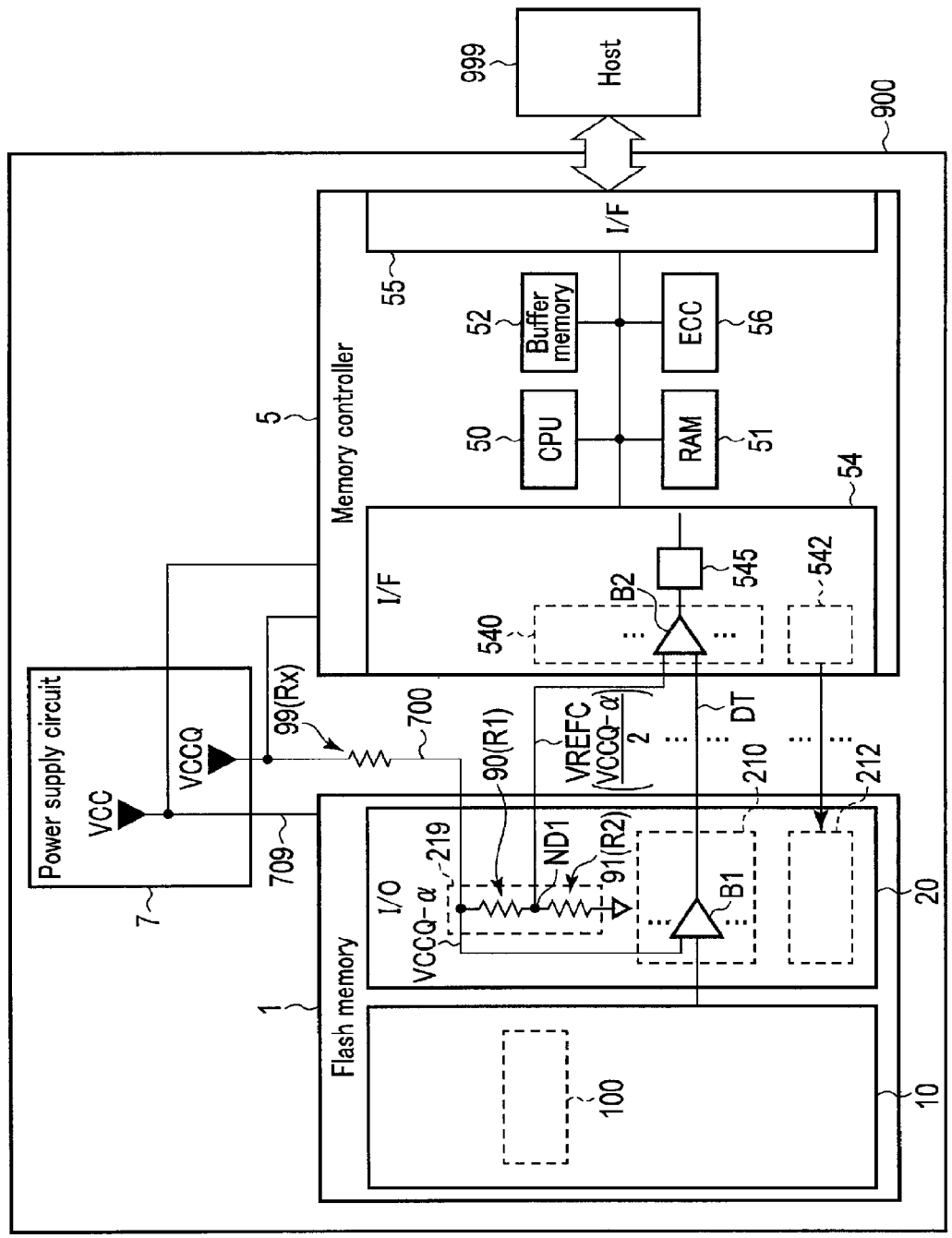
FIG. 1 is a schematic diagram showing a configuration example of a storage device according to an embodiment.

Hereinafter, embodiments will be described in detail with reference to the drawings. In the following description, elements having the same functions and configurations will be assigned the same reference numerals, and overlapping explanations will be made where necessary.

In general, according to one embodiment, a storage device includes a memory device including a memory cell configured to hold data, an output buffer configured to output the data, and a circuit configured to generate a reference voltage; and a controller device including an input buffer, wherein the data from the output buffer is input into one input terminal of the input buffer and the reference voltage from the circuit is input into the other input terminal of the input buffer.

[Embodiment]

Hereinafter, a storage device (memory system), a memory device, and a semiconductor device according to an embodiment will be described with reference to FIGS. 1 to 8.

(1) Configuration Example

A configuration example of the storage device according to an embodiment will be described using FIGS. 1 to 5.

FIG. 1 is a schematic diagram showing a storage device (and a memory system) according to an embodiment.

As shown in FIG. 1, a storage device 900 is coupled to a host (host device) 999 directly or indirectly via interconnects on a board, wireless communication, the Internet, a cable or the like.

The host 999 requests the storage device 900 to write data or to read data.

The storage device 900 operates based on a request from the host 999.

The storage device 900 includes a memory device 1 and a memory controller 5.

The memory controller 5 includes, for example, a processor (CPU) 50, a work memory (RAM) 51, a buffer memory 52, a memory interface circuit 54, a host interface circuit 55, and an ECC circuit 56.

The CPU 50 controls overall operation of the memory controller 5. For example, the CPU 50 issues a command based on the standard and specifications of the memory device 1 in response to a request from the host 999. The CPU 50 controls the operation of the memory device 1 by referring to information in a management table. The CPU 50 performs various kinds of processing to manage the memory device 1, such as wear leveling. The CPU 50 performs various kinds of operations, such as encryption processing of data and randomization processing.

The work memory 51 and the buffer memory 52 hold various kinds of data and programs (software/firmware) used in the storage device 900 and management information.

For example, the work memory 51 is DRAM and is used as a work area of the CPU 50. The work memory 51 temporarily holds software/firmware to control the operation of the memory device 1 and one or more management tables to manage the memory device 1.

For example, the buffer memory 52 is SRAM. The buffer memory 52 temporarily holds data transferred between the host 999 and the memory device 1.

The memory interface circuit 54 is connected to the memory device 1 via a plurality of signal lines (not shown) in a bus. The memory interface circuit 54 controls communication to the memory device 1. The memory interface circuit 54 transfers a command from the CPU 50 to the memory device 1. The memory interface circuit 54 transfers data in the buffer memory 52 to the memory device 1 when data is written into the memory device 1. The memory interface circuit 54 transfers data from the memory device 1 into the buffer memory 52 when data is read from the memory device 1.

The memory interface circuit 54 includes an input buffer circuit 540, an output buffer circuit 542, and a data latch circuit 545 to transmit/receive a signal (and data).

The input buffer circuit 540 includes a plurality of input buffers B2. A signal and data from the memory device 1 are input into the input buffer B2. For example, the input buffer B2 to receive (sample) data DT from the memory device 1 is a differential amplifier.

The output buffer circuit 542 includes a plurality of output buffers (not shown). The output buffer circuit 542 outputs a signal and data from the memory controller 5 to the memory device 1.

The data latch circuit 545 temporarily holds an output signal DIN from the input buffer B2. The data latch circuit 545 temporarily holds a signal from the CPU 50 or the buffer memory 52.

The host interface circuit 55 connects the memory controller 5 to the host 999. The host interface circuit 55 controls communication to the host 999. The host interface circuit 55 processes a request and data from the host 999.

The ECC circuit 56 performs error checking and correcting (ECC) processing of data. The ECC circuit 56 generates parity based on data to be written when the data is written into the memory device 1. The ECC circuit 56 detects an error in data by generating a syndrome from parity when the data is read from the memory device 1. The ECC circuit 56 corrects a detected error. Incidentally, the CPU 50 may have the function of the ECC circuit 56.

The memory device 1 includes a circuit group 10 including a memory cell array 100 and an input/output circuit 20. For example, the memory device 1 is a flash memory. The storage device 900 including the flash memory is a memory card (for example, an SD (trademark) card), a USB memory, embedded Multi Media Card (eMMC (trademark)), Solid State Drive (SSD) or the like.

The memory cell array 100 is controlled by a plurality of circuits in the circuit group 10 described below based on commands from the memory controller 5. Accordingly, writing (write operation) of data into the memory cell array 100 and reading (read operation) of data from the memory cell array 100 are performed.

The input/output circuit (I/O circuit) 20 receives various kinds of signals and data from the memory controller 5. The input/output circuit 20 sends various kinds of signals and data from inside the memory device 1 to the memory controller 5.

The input/output circuit 20 includes an output buffer circuit 210 and an input buffer circuit 212.

The output buffer circuit 210 is connected to the input buffer circuit 540 of the memory controller 5 via a signal line. The output buffer circuit 210 includes a plurality of output buffers B1. One output buffer B1 in the memory device 1 sends a signal/data to one input buffer B2 in the memory controller 5 via a signal line.

The input buffer circuit 212 is connected to the output buffer circuit 542 of the memory controller 5 via a signal line.

In the present embodiment, the input/output circuit 20 includes a circuit 219 to generate a reference voltage VREFC. The reference voltage VREFC is the reference voltage for signal transmission between the buffers B1, B2. The reference voltage VREFC is supplied from the memory device 1 to the input buffer (differential amplifier) B2 of the memory controller 5 together with an output signal of the output buffer B2.

For example, the circuit 219 includes a plurality of resistance elements 90, 91. One end of the resistance element 90 is connected to a power supply terminal common to the output buffer B2. The other end of the resistance element 90 and one end of the resistance element 91 form a connection node ND1. The other end of the resistance element 91 is grounded. The reference voltage VREFC is output from the connection node ND1 of the resistance element 90 and the resistance element 91.

For example, the reference voltage VREFC has a voltage value larger than 0 V. For example, the reference voltage VREFC having a substantially constant voltage value is generated and output by the circuit 219 during operation (during signal transmission) of the memory device.

Hereinafter, for the simplification of description, the circuit group 10 in the memory device 1 excluding the input/output circuit 20 will be called a core circuit 10.

A power supply circuit 7 is provided in the storage device 900.

The power supply circuit 7 may also be provided outside the storage device 900. For example, the power supply circuit 7 may be provided in the host 999. The power supply circuit 7 is preferably provided on the same board (for example, the motherboard) as that of the storage device 900.

The power supply circuit 7 supplies power supply voltages VCC, VCCQ and the ground voltage to the memory device 1 and the memory controller 5.

The power supply circuit 7 has a plurality of power supplies (power supply system). An interconnect (power line) 700 to supply the power supply voltage VCCQ is different from an interconnect 709 to supply the power supply voltage VCC. Thus, a power supply system of the power supply voltage VCCQ is electrically separated from the power supply system of the power supply voltage VCC.

For example, the power supply voltage VCCQ is applied to the input/output circuit 20 of the memory device 1 and the memory interface circuit (input/output circuit) 54 of the memory controller 5. For example, the driving voltage of the input buffer B2 of the memory interface circuit 54 is the voltage VCCQ.

For example, the power supply voltage VCC is supplied to the core circuit 10 of the memory device 1 and the CPU 50 of the memory controller 5.

The voltage value of the power supply voltage VCCQ may be the same as or different from the voltage value of the power supply voltage VCC depending on the specifications and standards of the storage device 900, the memory device 1, and the memory controller 5.

In the present embodiment, the signal transfer (data transfer) between a buffer of the memory device 1 and a buffer of the memory controller 5 is performed using the reference voltage VREFC as a reference value of signal sampling. For example, the signal transfer between buffers in the transfer of data between devices in the present embodiment is performed by a single-end method.

In the present embodiment, as shown in FIG. 1, the reference voltage VREFC of the input buffer B2 of the memory controller is supplied from the memory device 1 to the memory controller 5. The reference voltage VREFC is generated by the resistor circuit (reference voltage generator) 219 in the memory device 1.

The memory controller 5 determines a signal level of the DT from the memory device 1 using the reference voltage VREFC supplied from the memory device 1 (resistor circuit 219).

The voltage applied to the output buffer B2 and the resistor circuit 219 in the memory device 1 may be a voltage lower than the power supply voltage VCCQ due to a voltage drop value α in accordance with a resistance value Rx of a parasitic resistance 99 between the memory device 1 and the power supply circuit 7.

The memory controller 5 can sample the data DT output from the memory device 1 so as to follow fluctuations (for example, the voltage drop) of the power supply voltage in the memory device 1 by, like in the present embodiment, the reference voltage VREFC being generated in the memory device 1.

<Configuration Example of the Memory Device>

A configuration example of the memory device according to the present embodiment will be described using FIGS. 2 to 4.

FIG. 2 is a plan view illustrating a structure example of the memory device.

As shown in FIG. 2, the memory device 1 includes a plurality of terminals 190, 191, 192, 193, 194, 195.

The terminals 190 to 195 are connection terminals to connect the memory device 1 and other devices. The connection terminals (external connection terminals) 190 to 195 are, for example, at least one kind of terminal selected from pins, pads, and solder balls (grid balls).

The connection terminals 191, 192, 193, 194 are connected to the power supply circuit 7.

The power supply voltages VCCQ, VCC are applied from the power supply circuit 7 to the connection terminals (hereinafter, called power supply terminals) 191, 193 respectively.

The power supply terminals 191, 193 are connected to the I/O circuit 20 and the core circuit 10 via internal interconnects 801, 803 in the memory device 1 respectively.

Ground voltages VSSQ, VSS are applied from the power supply circuit 7 to the connection terminals (hereinafter, called ground terminals) 192, 194 respectively.

For example, the ground voltage VSSQ is a ground voltage for the I/O circuit 20. In the memory device 1, the ground terminal 192 is connected to the I/O circuit 20 via an internal interconnect 802. The ground voltage VSS is a ground voltage for the core circuit 10. The ground terminal 194 is connected to the core circuit 10 via an internal interconnect 804 in the memory device 1.

The one or more connection terminals 195 are used to send or receive commands, various control signals CNT, data DT, and addresses. The connection terminal 195 is connected to a data line DQ. For example, the control signal CNT is a read enable signal bREN, a data strobe signal DQS or the like.

The connection terminal 190 is a connection terminal (voltage terminal) to output the reference voltage VREFC out of the memory device 1.

In FIG. 2, an example is shown in which the connection terminals 190 to 195 are provided along one end of a surface of the memory device 1, but they may also be provided along two ends opposite to each other of a surface of the memory device. The connection terminals 190 to 195 may also be provided such as to surround a surface of the memory device 1. The connection terminals 190 to 195 may also be provided such as to be distributed over a surface of the memory device 1.

For example, the input/output circuit 20 is provided on a semiconductor substrate (for example, a semiconductor chip like a silicon chip) 80, which is the same semiconductor substrate as that of the core circuit (memory cell array) 10.

Constituting elements of the input/output circuit 20 are provided, together with the core circuit 10, in a plurality of regions (hereinafter, called input/output circuit regions) 291 in the semiconductor substrate 80 of the memory device 1.

If, for example, the input/output circuit 20 is provided on the same semiconductor substrate 80 as the core circuit 10, the input/output circuit regions 291 are provided in a region between the region where the connection terminals 191 to 195 are arranged and the region where the core circuit 10 is arranged in a view from the vertical direction to the surface of the semiconductor substrate 80.

The power supply terminal 191 is connected to a voltage node in an input/output circuit region 200 via the internal interconnect 801 in the memory device 1. Accordingly, the power supply voltage VCCQ (VCCQ-α) is applied to the I/O circuit 20.

The ground voltage VSSQ is applied to a ground node in the input/output circuit region 200 (I/O circuit 20) via the ground terminal 192 and the internal interconnect 802.

The resistance elements 90, 91 are provided in a region (hereinafter, called a resistance element region) 295 adjacent to the input/output circuit regions 291. For example, the resistance element region 295 is provided between the plurality of input/output circuit regions 291.

An input node in the resistance element region 295 is connected to the power supply terminal 191 via, for example, the internal interconnect 801. An output node in the resistance element region 295 is connected to the reference voltage terminal 190 (VREFC) via the internal interconnect 800. A ground node in the resistance element region 295 is connected to the ground terminal 192 via the interconnect 802.

The input terminal of the resistor circuit 219 is one end of the resistance element 90. The output terminal of the resistor circuit 219 is the connection node ND1 of the resistance element 90 and the resistance element 91. The other end of the resistance element 91 is connected to the ground terminal 192 (VSSQ).

The resistance elements 90, 91 include at least one of elements including a diffusion layer provided in the semiconductor substrate 80 and elements including a conductor (for example, a polysilicon layer) provided on the semiconductor substrate 80.

The resistance elements 90, 91 (resistance element region 295) may be provided in a region near the input/output circuit region 290 or a region vertically overlapping with a connection terminal in a direction perpendicular to the surface of the semiconductor substrate 80.

Figure 3:
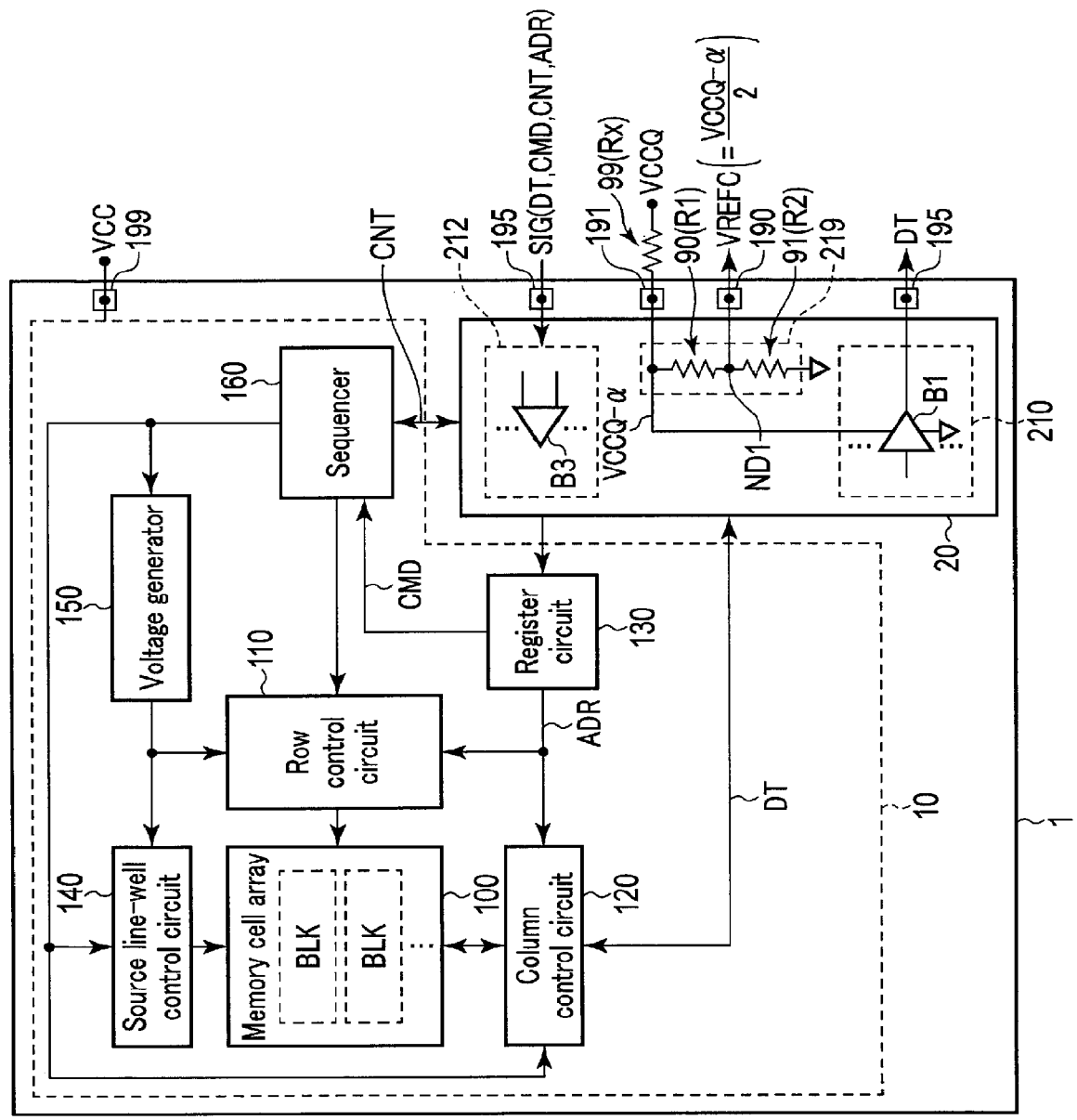
FIG. 3 is a block diagram showing a configuration example of the memory device according to an embodiment.

FIG. 3 is a block diagram illustrating an internal configuration of the memory device.

As described above, the memory device 1 includes the memory cell array 100. If the memory device 1 is a NAND type flash memory, the memory cell array 100 includes a plurality of blocks. In the NAND type flash memory, for example, a block BLK is a control unit for an erase operation.

FIG. 4 is an equivalent circuit diagram showing a configuration example of the block of a memory cell array of a NAND type flash memory.

In the NAND type flash memory, for example, each block BLK includes a plurality of memory units (NAND strings) MU. The plurality of NAND strings are arranged in the X direction.

Each NAND string MU includes a plurality of memory cells MC and two select gate transistors STD, STS.

In each memory cell unit MU, a current path of the plurality of memory cells MC0, MC1, . . . , MC (m−1) is connected in series. In the description that follows, when each of the memory cells MC0, MC1, . . . , MC (m−1) is not distinguished, each memory cell is denoted as the memory cell MC.

The memory cell MC is, for example, a transistor including a charge storage layer. The charge storage layer includes at least one of a floating electrode and a charge trap layer (for example, an SiN layer).

The current path of the select gate transistor STD is connected in series to one end (drain side) of the memory cells MC connected in series.

The current path of the select gate transistor STS is connected in series to the other end (source side) of the memory cells MC connected in series.

A plurality of word lines WL0, WL1, . . . , WL(m−1) are provided in the block BLK. A plurality of bit lines BL0, BL1, . . . , BL(n−1) are provided in the block BLK. In the description that follows, when each of the word lines WL0, WL1, . . . , WL(m−1) is not distinguished, each word line is denoted as the word line WL. When each of the bit lines BL0, BL1, . . . , BL(m−1) is not distinguished, each bit line is denoted as the bit line BL.

One word line WL is connected in common to the gates of the plurality of memory cells MC arranged in the X direction. One or more pages PG are allocated to the plurality of memory cells MC connected to the common word line. The page PG is the control unit for writing or reading data in a NAND type flash memory.

One bit line BL is connected to one end (drain) of the current path of the select gate transistor STD.

A source line SL is provided in the block BLK. The source line SL is connected to one end (source) of the current path of the select gate transistor STS.

Drain side and source side select gate lines SGDL, SGSL are provided in the block BLK. The drain side select gate line SGDL is connected to the gates of the select gate transistors STD arranged in the X direction. The source side select gate line SGSL is connected to the gates of the select gate transistors STS arranged in the X direction.

An operation on the memory cell array is performed by potentials of the word lines WL, the bit lines BL, the source line SL, and the select gate lines SGDL, SGSL being controlled.

The memory cell array 100 may have a three-dimensional structure. In the memory cell array in the three-dimensional structure, a plurality of memory cells are arranged along the X direction and the Y direction parallel to the surface of the semiconductor substrate 80 and also stacked in the Z direction perpendicular to the surface of the semiconductor substrate 80. In the memory cell array in the three-dimensional structure, for example, a plurality of word lines WL extend in the X direction and the Y direction and are also stacked in the Z direction.

A row control circuit 110 controls the rows of the memory cell array 100. The row control circuit 110 is connected to the word line WL and the select gate lines SGDL, SGSL provided in the memory cell array 100. The row control circuit 110 selects the block BLK and the page PG based on a selected address and controls the operation (potentials) of the word line WL and the select gate lines SGDL, SGSL. For example, the row control circuit 110 includes a row decoder and a driver.

A column control circuit 120 controls the columns of the memory cell array 100. The column control circuit 120 includes, for example, a sense amplifier circuit, a page buffer circuit, and a column decoder.

The sense amplifier circuit is connected to the bit line BL provided in the memory cell array 100. The sense amplifier circuit detects current generation or potential fluctuations in the bit line BL during a read operation and amplifies a signal based on the detected current/potential. Accordingly, data stored in the memory cell MC is determined. The sense amplifier circuit can control the potential of the bit line BL in accordance with data to be written into the memory cell MC during a write operation.

The page buffer circuit temporarily stores data read from the memory cell array 100 and data to be written into the memory cell array 100.

The column decoder selects and activates the control unit set for columns of the memory cell array 100.

A source line-well control circuit 140 controls the potential of the source line SL and the potential of a well region in the memory cell array.

A voltage generator 150 generates a write voltage, a read voltage, and a non-selection voltage (pass voltage) applied to the word line WL for a write operation, a read operation, and an erase operation respectively. The voltage generator 150 generates, for example, a voltage applied to the select gate lines SGDL, SGSL. Various voltages generated by the voltage generator 150 are input into the row control circuit 110 and applied to the word line WL and the select gate lines SGDL, SGSL.

The voltage generator 150 generates a voltage to control the bit lines and the column control circuit 120. The voltage generator 150 transfers the generated voltage to the column control circuit 120. The voltage generator 150 generates a voltage applied to the source line SL and a voltage applied to the well region. The voltage generator 150 transfers the generated voltage to the source line-well control circuit 140.

A register circuit 130 temporarily holds data, a command CMD, and an address ADR from the memory controller 5. The register circuit 130 transfers held data to the column control circuit 120 at a certain timing. The register circuit 130 transfers a held command to a sequencer 160 at a certain timing. The register circuit 130 transfers a held address to the row control circuit 110 and the column control circuit 120 at a certain timing.

The sequencer (also called a state machine) 160 manages an overall operation of the flash memory 1. The sequencer 160 controls the operation of each circuit in the flash memory 1 based on the command CMD and the control signal CNT from the controller 5.

The sequencer 160 sends a control signal (status) indicating an internal operation status of the flash memory 1 to the controller 5. Accordingly, the controller 5 is notified of the operation status of the flash memory 1.

As described above, the input/output circuit 20 includes the input buffer circuit 212, the output buffer circuit 210, and the resistor circuit 219.

The input buffer circuit 212 includes one or more input buffers B3. Each input buffer B3 receives signals SIG such as commands CMD, addresses ADR, data DT, or various control signals CNT from the memory controller 5. The input buffer B3 outputs the received signal SIG to the register circuit 130. For example, the input buffer B3 may be a differential amplifier.

The output buffer circuit 210 outputs the data DT in the memory cell array 100 and the control signal CNT based on the control of the sequencer 160 to the memory controller 5.

The output buffer circuit 210 includes one or more output buffers B1. One driving voltage node of the output buffer B1 is connected to the power supply terminal 191 (VCCQ, VCCQ-α) and the other driving voltage node (ground node) of the output buffer B1 is connected to the ground terminal 192. The output terminal of the output buffer B1 is connected to a signal line (DQ line) via the connection terminal 195.

The resistor circuit 219 includes the first resistance element 90 and the second resistance element 91.

One end of the first resistance element 90 is connected to the power supply terminal 191, the other end of the first resistance element 90 is connected to one end of the second resistance element 91, and the other end of the second resistance element 91 is connected to the ground terminal 192.

Thus, the voltages VCCQ-α, VSSQ, which are the same as those supplied to the output buffer B1, are supplied to the resistor circuit 219.

The connection node ND1 of the resistance element 90 and the resistance element 91 is connected to the reference voltage terminal 190 (VREFC). Accordingly, the reference voltage VREFC is output from the resistor circuit 219 to the outside of the flash memory 1.

A resistance value R1 of the resistance element 90 has substantially the same value as a resistance value R2 of the resistance element 91. Thus, the voltage (potential) in the connection node ND1 is divided to a level about half the voltage VCCQ−α (α≥0V) supplied to the resistor circuit 219. The divided voltage (VCCQ−α)/2 is used as the reference voltage VREFC. The reference voltage VREFC is supplied to, as shown in FIG. 1, one input terminal of the input buffer B2 of the memory controller 5.

In the present embodiment, therefore, the flash memory 1 generates the reference voltage VREFC for signal transmission using the circuit 219 inside and supplies the generated reference voltage VREFC to the memory controller 5.

In the storage device (memory system) according to the present embodiment, while data is transferred between the memory device 1 and the memory controller 5, the output buffer B1 in the device on the data sending side (in the present embodiment, the memory device 1) converts the signal level of data (H/L level signal) output from the core circuit (memory cell array) 10 into a signal level based on the voltages VCCQ (VCCQ−α), VSSQ. The output buffer B1 outputs the converted signal to the other device 5 as the data DT.

The device on the data receiving side (in the present embodiment, the memory controller 5) receives the signal DT from the output buffer B1 of the memory device 1 via the data line DQ. Also, the reference voltage VREFC is supplied from the memory device 1 to the memory controller 5.

In the memory controller 5, the input buffer B2 determines whether the input signal DT is at an H level or an L level using the reference voltage VREFC as the reference level.

In the memory controller 5, the input buffer B2 outputs a signal DIN based on a determination result of the reference voltage VREFC and the input signal DT to the data latch circuit 545 subsequent to the input buffer.

Figure 5:
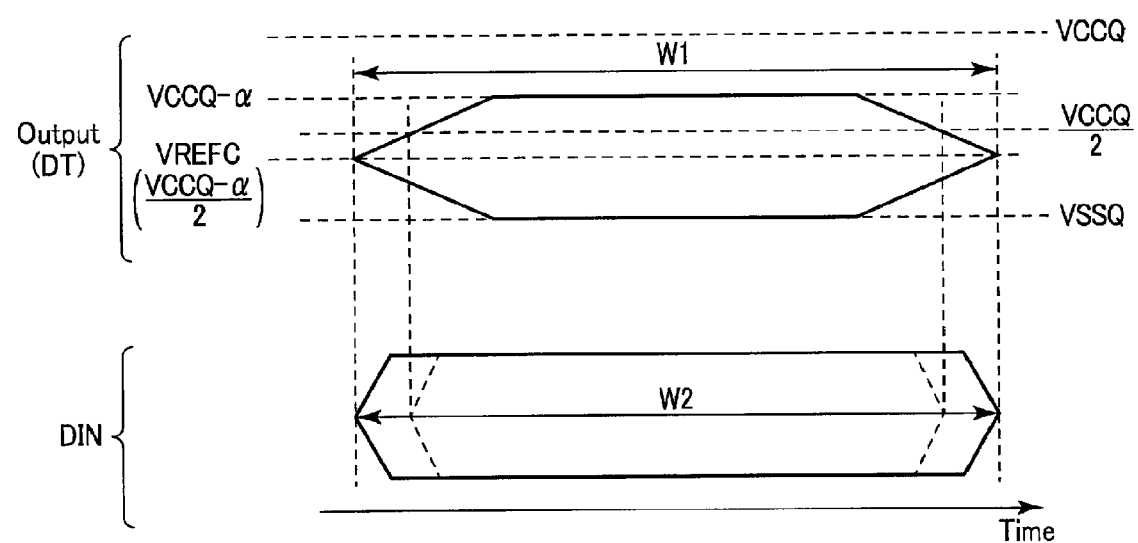
FIG. 5 is a diagram illustrating data transfer in the storage device according to an embodiment.

FIG. 5 shows the waveform of a signal transferred between two devices in a storage device according to the present embodiment. The horizontal axis of FIG. 5 corresponds to the time and the vertical axis of FIG. 5 corresponds to the signal level (voltage). In FIG. 5, a 1-bit signal (data window) is illustrated for the sent signal and the received signal.

For example, due to the parasitic resistance 99 between the power supply circuit 7 and the memory device 1, an IR drop in accordance with the resistance value Rx may arise in the voltage applied to the memory device. In such a case, the voltage applied to the input/output circuit 20 in the memory device 1 is a voltage VCC−α lower than the voltage VCCQ in accordance with the voltage drop (a) caused by the parasitic resistance 99.

If, as shown in FIG. 5, the driving voltage on the high potential side of the output buffer B1 falls below the power supply voltage VCCQ, the H level of an output signal of the output buffer B1 (device on the sending side of data) corresponds to the voltage VCCQ−α.

If the reference voltage applied to the input buffer of a device on the receiving side of data is a voltage (half the power supply voltage) VCCQ/2, an H-level signal as the voltage VCCQ−α is compared with the reference voltage VCCQ/2 without consideration of a voltage drop. In this case, the duty of the output signal DIN of the input buffer B2 is distorted with respect to a signal from the output buffer B1. As a result, the time component of a signal may be shifted, causing jitters or skews.

In a storage device according to the present embodiment, the reference voltage VREFC=(VCCQ−α)/2 is generated in the flash memory 1 using the voltage (voltage including a voltage drop) VCCQ−α that is substantially the same as the driving voltage of the output buffer B1.

The generated reference voltage (VCCQ−α)/2 is supplied from the output buffer B1 of the flash memory 1 to the input buffer B2 of the memory controller 5 together with the data DT.

The input buffer B2 determines the signal level of the input signal (signal from the output buffer B1) DT using the reference voltage (VCCQ−α)/2 in which a voltage drop is reflected as the reference level.

In the present embodiment, the voltage value VCCQ−α output from the output buffer B1 and corresponding to the H level is compared with the reference voltage (VCCQ−α)/2 by the input buffer B2.

Accordingly, in the present embodiment, the distortion of duty (for example, a reduced data window width) of the output signal DIN of the input buffer B2 is limited. For example, a window width W2 of the output signal DIN of the input buffer B2 becomes substantially the same as a window width W1 of an output signal DT of the output buffer B1.

Accordingly, a storage device according to the present embodiment can limit defects of data transfer caused by time axis shifts of a signal such as operation defects caused by sampling of an unsteady signal.

Also, the storage device according to the present embodiment can improve the degree of margin of setting a data setup time (tDS) and a data hold time (tDH) defined based on specifications/standards of the device because the period in which a signal is unsteady for data sampling is reduced. Therefore, the storage device according to the present embodiment can improve the speed of data transfer.

When a voltage drop caused by a parasitic resistance does not arise in the power supply voltage applied to the memory device 1 (when α=0V), the voltage (voltage VCCQ) supplied to the resistor circuit 219 has substantially the same voltage value as the voltage supplied to the output buffer B1 (output buffer circuit 210) Also in this case, therefore, the voltage value of the reference voltage VREFC is about half (voltage value VCCQ/2) of the voltage value corresponding to an H-level signal of the output buffer B2

As described above, a storage device (memory system) according to the present embodiment can improve data transfer reliability.

(2) Operation Example

An operation example of a storage device (memory system) according to the present embodiment will be described with reference to FIG. 6. Here, in addition to FIG. 6, FIGS. 1 to 5 are also used to describe an operation example of the storage device.

Figure 6:
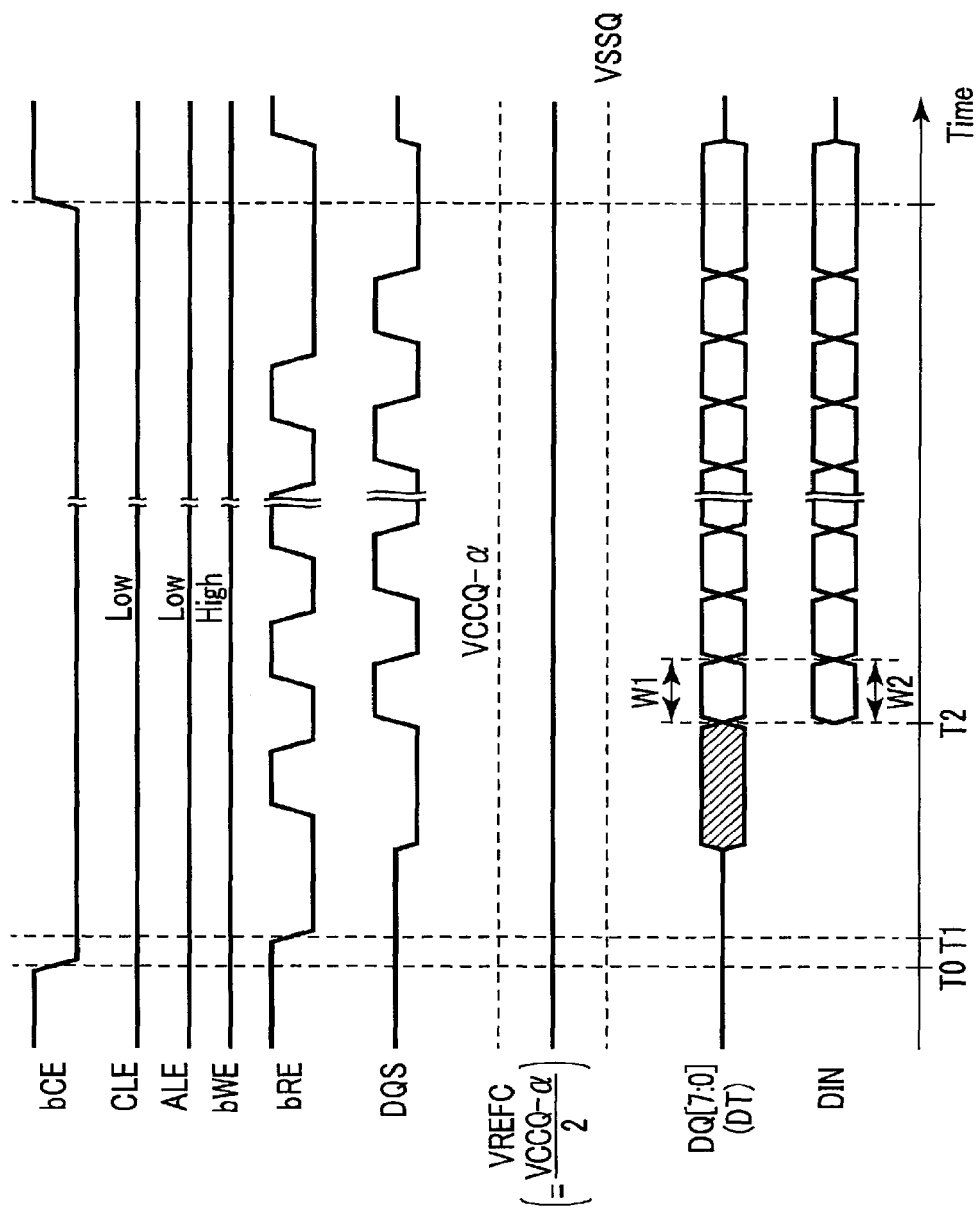
FIG. 6 is a timing chart showing an operation example of the storage device according to an embodiment.

FIG. 6 is a timing chart showing an operation example of the storage device according to the present embodiment.

The horizontal axis of FIG. 6 corresponds to the time and the vertical axis of FIG. 6 corresponds to the signal level of each signal.

The operation shown in FIG. 6 relates to data transfer between a memory device and a memory controller. In the operation shown in FIG. 6, data read from the memory device (for example, a NAND type flash memory) 1 is transferred to the memory controller 5.

Based on a request from the host 999, the memory controller 5 starts a read operation of the memory device (NAND type flash memory) 1.

The memory controller 5 sends a read command and a selected address to the NAND type flash memory 1.

In the storage device (memory system) 900 including the flash memory 1, the read command and the selected address are incorporated into the register circuit 130 via the input/output circuit 20 at a timing based on, for example, various control signals such as a command latch enable signal CLE and an address latch enable signal ALE.

Based on the read command and the selected address, the flash memory 1 starts to read data from the memory cell array 100.

Based on the received read command and selected address, the sequencer 160 controls the operation of each circuit in the flash memory 1 for the read operation.

Accordingly, the data DT is output from a page indicated by the address in the memory cell array (block) 100 to a page buffer circuit of the column control circuit 120.

The data DT is output from the page buffer circuit to the output buffer B2 of the input/output circuit 20.

A time T0, as shown in FIG. 6, the memory controller 5 controls various control signals. The memory controller 5 changes the signal level of a chip enable signal bCE from the H level to the L level. The memory controller 5 sets the command latch enable signal CLE and the address latch enable signal ALE to the L level. The memory controller 5 sets a write enable signal bWE to the H level.

At time T1, the memory controller 5 sends a read enable signal bRE having some frequency to the flash memory 1. The flash memory 1 receives a read enable signal bRE from the memory controller 5.

The sequencer 160 generates a data strobe signal DQS having some frequency based on the read enable signal bRE. The data strobe signal DQS is output to the memory controller 5 via the input/output circuit 20.

At time T2, based on, for example, the Double Data Rate(DDR) standard, the data DT is transferred between the memory device 1 and the memory controller 5 at a timing synchronized with the data strobe signal DQS.

The plurality of output buffers B1 outputs the data DT onto the data line DQ [7:0] corresponding to the output buffer B2 at a the timing synchronized with the data strobe signal DQS.

The signal output from the output buffer B1 has a signal level (H level) corresponding to the driving voltage VCCQ-$\alpha$ ($\alpha \geq 0$V) applied to the output buffer B1 or a signal level (L level) corresponding to the ground voltage VSSQ applied to the output buffer B1 in accordance with data ("0" or "1") read from the memory cell array 100.

When data of the DDR standard is transferred, a plurality of pieces of data (data unit) DT are sequentially transferred from the flash memory 1 to the memory controller 5 in timing using both the rise and fall of the data strobe signal DQS.

In FIG. 6, a signal (data) is present on the data line DQ at a timing in which the center of the H level (or the L level) in the data strobe signal DQS and the center of an effective window of the data DT match. However, in accordance with the standard, specifications, and type of the device that transfers data, the signal may be present on the data line DQ at a timing in which the rise (or the fall) of the data strobe signal DQS and the center of the effective window of the data unit match.

In the present embodiment, the memory controller 5 receives the data DT and the reference voltage VREFC from the flash memory 1.

In the memory controller 5, the data DT is input into one input terminal of the input buffer B2 and the reference voltage VREFC=(VCCQ-$\alpha$)/2 is input into the other input terminal of the input buffer B2.

The input buffer B2 compares the signal level of the signal input as data with the reference voltage VREFC=(VCCQ-$\alpha$)/2.

The input buffer B2 outputs the signal DIN based on a comparison result of the reference voltage VREFC=(VCCQ-$\alpha$)/2 and the input signal DT to the data latch circuit 545 in the memory controller 5.

In the input buffer B2, if the level of the input signal DT is equal to the reference voltage (VCCQ-$\alpha$)/2 or more, the signal is determined to be "0" data. On the other hand, if the level of the input signal DT is less than the reference voltage (VCCQ-$\alpha$)/2, the signal is determined to be "1" data.

The input buffer B2 outputs the signal incorporated based on the reference voltage (VCCQ-$\alpha$)/2 to the data latch circuit 545 as the output signal DIN. In the present embodiment, the duty of the output signal DIN is substantially the same as the duty of the output signal DT of the memory device 1. For example, the data window width W2 of the output signal DIN of the input buffer B2 becomes substantially the same as the data window width W1 of an output signal DT of the output buffer B1.

Data in the data latch circuit 545 is transferred to the host 999 via the buffer memory 52 and the host interface circuit 55 at a predetermined timing.

In the read operation of the memory device 1, data is sequentially transferred from the output buffer to the input buffer in a cycle synchronized with the data strobe signal (read enable signal) DQS in the above signal transmission between the output buffer B1 and the input buffer B2 until the transfer of data requested from the host is completed.

With the above processing, data transfer between a memory device and a memory controller in a storage device according to the present embodiment is completed.

When a signal is transmitted between the output buffer B1 and the input buffer B2 as described above, a voltage from the power supply circuit 7 is applied to the output buffer B1. If, for example, a voltage drop (quantity of drop: $\alpha$) arises in the power supply voltage VCCQ due to the parasitic resistance 99, the driving voltage of the output buffer B1 (input/output circuit 20) becomes the voltage VCCQ-$\alpha$ of a magnitude obtained by subtracting the quantity of drop $\alpha$ from the power supply voltage VCCQ.

In the present embodiment, the reference voltage VREFC used for signal transmission is generated by the resistor circuit 219 using the internal voltage VCCQ-$\alpha$ of the flash memory 1. If no voltage drop due to the parasitic resistance 99 arises, the value $\alpha$ is zero and the power supply voltage VCCQ is applied to the output buffer circuit 210 (output buffer B1) and the resistor circuit 219.

The reference voltage VREFC is supplied from the flash memory 1 to the memory controller 5 via the connection terminal 190 of the flash memory 1 and an interconnect. The reference voltage VREFC is applied to the other input terminal of the input buffer B2 in the memory controller 5.

Therefore, deterioration of duty of a signal transferred between the output buffer B1 and the input buffer B2 is reduced by data being sampled by the input buffer B2 using the reference voltage VREFC using a voltage from the same power supply system as the output buffer B1.

Accordingly, in data transfer of a storage device according to the present embodiment, defects of the data transfer due to distortion of the duty (time component shifts) can be reduced and the degree of margin of operation timing during data transfer can be improved.

In the data transfer between the flash memory 1 and the memory controller 5 in the present embodiment, the data transfer may be based on the single data rate (SDR) standard.

As described above, a memory system according to the present embodiment can improve the data transfer reliability.

(3) Modification

A modification of the memory device according to the present embodiment will be described with reference to FIGS. 7 and 8.

Figure 7:
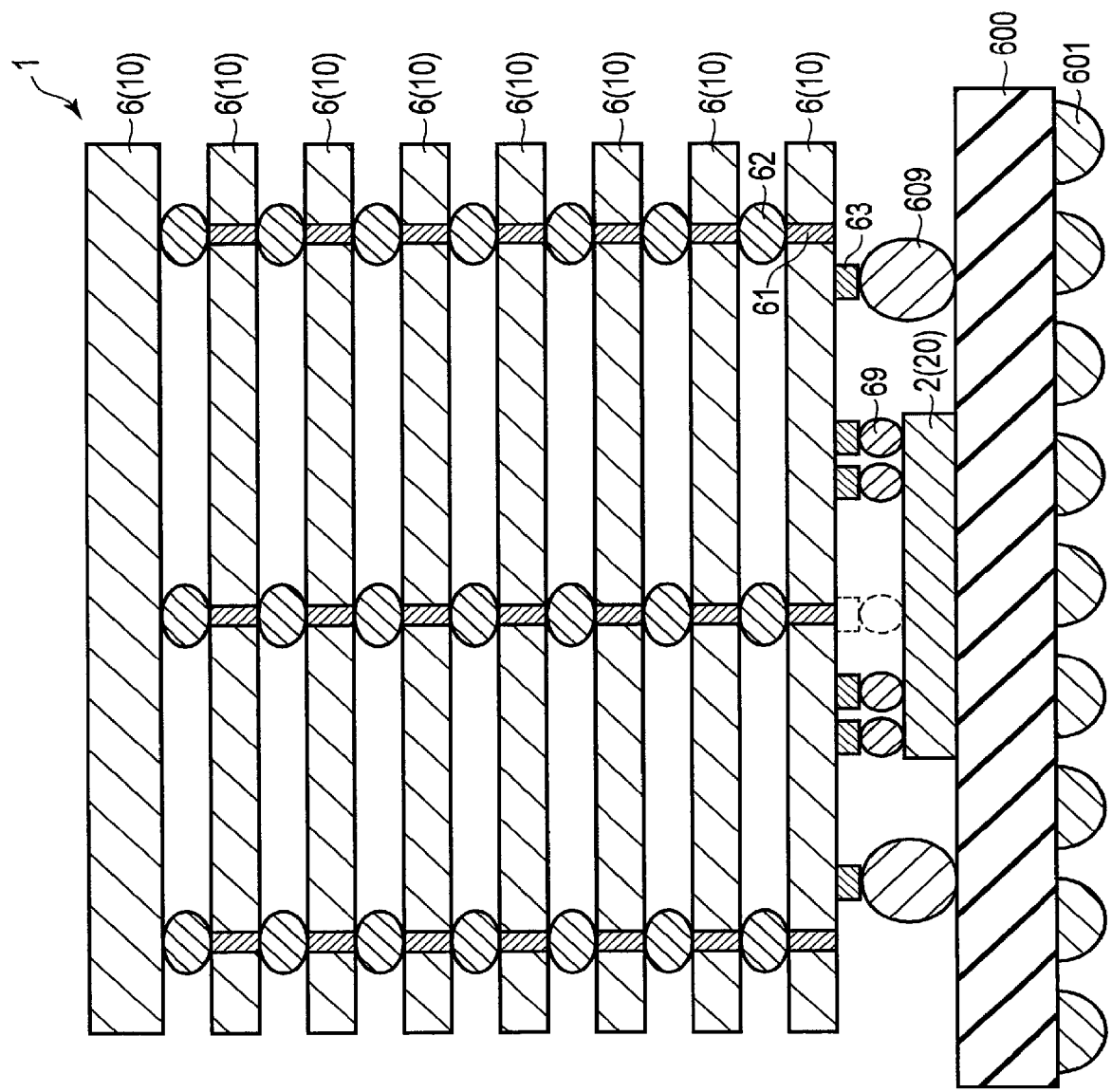
FIG. 7 is a diagram showing a modification of the memory device according to an embodiment.

As shown in FIGS. 7 and 8, the input/output circuit 20 may be provided on a different semiconductor substrate (silicon chip) from the core circuit (memory cell array) 10.

FIG. 7 is a diagram showing the structure of a memory device according to the present modification.

The memory device 1 in FIG. 7 is a device including a multi-chip package.

In the memory device 1 in FIG. 7, the input/output circuit 20 is provided on a different substrate from the memory cell array 100. In this case, a semiconductor chip (hereinafter, called an interface chip) 2 on which the input/output circuit 20 is provided is provided on a package board 600 so as to be contained in the same package material (not shown) as a semiconductor chip (hereinafter, called a memory core chip) 6 on which the core circuit 10 is provided.

A plurality of memory core chips 6 are stacked on the package board 600.

For example, the memory core chip 6 includes a TSV (through electrode) 61. The TSV 61 is a via reaching from the top surface to the undersurface of the chip 6. A bump 62 is provided between the TSV 61. The stacked chips 6 are thereby electrically connected to each other.

The interface chip 2 including the input/output circuit 20 is provided on the package board 600. The interface chip 2 is positioned between the lowest memory core chip 6 and the package board 600.

Interconnects 63 is provided on the undersurface of the lowest memory core chip 6. A bump 69 is provided between the interconnects 63 and the interface chip 2. The memory core chip 6 is thereby electrically connected to the interface chip 2.

A bump 609 is provided between the interconnect 63 and the package board 600. The memory core chip 6 and the interface chip 2 are thereby connected to interconnects in the package board 600.

A bump (for example, a solder ball) 601 is provided on the undersurface of the package board 600. The package board 600 is electrically connected to the outside (for example, a memory controller) via the bump 601.

FIG. 8 is a block diagram schematically showing the interface chip 2 on which the input/output circuit 20 is provided.

As shown in FIG. 8, like the above example, the input/output circuit 20 divides the voltage VCCQ (VCCQ-α), which is the same voltage as that supplied to the output buffer B2, by the resistance elements 90, 91 to generate the reference voltage VREFC in the interface chip 2.

The input/output circuit 20 outputs the reference voltage VREFC to the outside of the chip 2 and the memory device 1 via the package board 600.

As shown in FIGS. 7 and 8, in a memory device according to the present embodiment, the input/output circuit 20 that outputs the reference voltage VREFC may be provided on a different chip from the memory cell array 100.

(4) Other

In the above embodiment, a memory device (for example, a NAND type flash memory) is illustrated as a device on the sending side of a signal and a memory controller is illustrated as a device on the receiving side of a signal.

In the present embodiment, however, the device on the sending side may be a memory controller and the device on the receiving side may be a memory device. In this case, the memory controller generates the reference voltage VREFC. The reference voltage VREFC generated in the memory controller 5 is applied to the input buffer B3 of the input buffer circuit (input buffer) 212 of the memory device 1.

In the data transfer between the host 999 and the memory controller 5, the above embodiment may be applied to a buffer of the memory controller 5 and a buffer of the host 999.

In the present embodiment, the memory device is not limited to a NAND type flash memory. The memory device may be DRAM, SRAM, a magnetic memory (for example, MRAM), a resistance change memory (for example, ReRAM), a phase change memory (for example, PCRAM), or an ion memory.

Devices on the sending side and receiving side of a signal are not limited to the combination of a memory device and a memory controller. In addition to the memory device and memory controller, devices on the sending side and receiving side may appropriately be selected from, for example, a system LSI device, CPU, GPU, an image sensor, a wireless communication device and the like. The configuration of the above embodiment is applied to the selected device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A storage device comprising:
   a memory device including a memory cell configured to hold data, an output buffer configured to output the data based on a first voltage, and a circuit configured to generate a reference voltage based on the first voltage; and
   a controller device including an input buffer,
   wherein the circuit outputs the reference voltage based on the first voltage to the controller from the memory device,
   the output buffer outputs the data based on the first voltage to the input buffer, and
   the data from the output buffer is input into one input terminal of the input buffer and the reference voltage from the circuit is input into the other input terminal of the input buffer.

2. The device according to claim 1, further comprising:
   a power supply circuit configured to output a second voltage,
   wherein the first voltage equal to or lower than the second voltage is applied to the memory device,
   the circuit generates the reference voltage using the first voltage, and
   the output buffer outputs a signal corresponding to the data using the first voltage.

3. The device according to claim 2, wherein
   the power supply circuit is connected to the memory device via an interconnect, and
   the first voltage is lower than the second voltage by a voltage drop caused by the interconnect.

4. The device according to claim 2, wherein the reference voltage has a magnitude of half the first voltage.

5. The device according to claim 2, wherein
the output buffer outputs a first signal of a first level and a second signal of a second level,
the first level corresponds to the first voltage,
the second level corresponds to a ground voltage, and
the reference voltage has an intermediate magnitude between the first voltage and the ground voltage.

6. The device according to claim 2, wherein
an input terminal of the circuit is connected to a first terminal to which the first voltage is applied, and
an output terminal of the circuit is connected to a second terminal to output the reference voltage to the controller device.

7. The device according to claim 6, wherein
the circuit includes a first resistance element and a second resistance element,
the first terminal is connected to one end of the first resistance element, and
the second terminal is connected to a connection node between the other end of the first resistance element and one end of the second resistance element.

8. The device according to claim 1, wherein
the memory device is provided on a substrate,
the output buffer is provided in a first region of the substrate,
the circuit is provided in a second region of the substrate, and
the second region is adjacent to the first region.

9. A memory device comprising:
a memory cell configured to hold data;
a first terminal to which a first voltage is applied;
an output buffer configured to output the data from the memory cell to an input buffer outside of the memory device using the first voltage;
a circuit configured to generate a second voltage using the first voltage; and
a second terminal to output the second voltage generated by the circuit to the input buffer.

10. The device according to claim 9, wherein
the output buffer outputs a first signal of a first level and a second signal of a second level in accordance with the data,
the first level corresponds to the first voltage,
the second level corresponds to a ground voltage, and
the second voltage has an intermediate magnitude between the first voltage and the ground voltage.

11. The device according to claim 9, wherein
an input terminal of the circuit is connected to the first terminal, and
an output terminal of the circuit is connected to the second terminal.

12. The device according to claim 9, wherein
the circuit includes a first resistance element and a second resistance element,
the first terminal is connected to one end of the first resistance element, and
the second terminal is connected to a connection node between the other end of the first resistance element and one end of the second resistance element.

13. The device according to claim 9, wherein
the output buffer and the circuit are provided on a substrate,
the output buffer is provided in a first region of the substrate,
the circuit is provided in a second region of the substrate, and
the second region is adjacent to the first region.

14. The device according to claim 9, further comprising:
first chip and second chips,
wherein
the first chip includes the output buffer, the first circuit, the first terminal and the second terminal,
each of the second chips includes the memory cell and an electrode reaching from a top surface of a second chip to an under surface of a second chip,
the second chips are stacked along a direction from the top surface of the second chip to the under surface of the second chip, and
each of the second chips is electrically connected to the first chip by the electrode.

15. A semiconductor device comprising:
a first device including an output buffer configured to output a signal based on a first voltage and a circuit configured to generate a reference voltage based on the first voltage; and
a second device including an input buffer,
wherein the circuit outputs the reference voltage based on the first voltage to the second device from the first device,
the output buffer outputs the signal based on the first voltage to the input buffer, and
the signal based on the first voltage is input into one input terminal of the input buffer and the reference voltage based on the first voltage is input into the other input terminal of the input buffer.

16. The device according to claim 15, further comprising:
a power supply circuit configured to output a second voltage,
wherein the first voltage equal to or lower than the second voltage is applied to the first device.

17. The device according to claim 16, wherein
the power supply circuit is connected to the first device via an interconnect, and
the first voltage is lower than the second voltage by a voltage drop caused by the interconnect.

18. The device according to claim 16, wherein
the reference voltage has a magnitude of half the first voltage.

19. The device according to claim 16, wherein
the output buffer outputs a first signal of a first level and a second signal of a second level,
the first level corresponds to the first voltage,
the second level corresponds to a ground voltage, and
the reference voltage has an intermediate magnitude between the first voltage and the ground voltage.

20. The device according to claim 16, wherein
the circuit includes a first resistance element and a second resistance element,
the first voltage is applied to one end of the first resistance element, and
the reference voltage is output from a connection node between the other end of the first resistance element and one end of the second resistance element.

* * * * *